(12) United States Patent
Cripe

(10) Patent No.: US 8,786,389 B1
(45) Date of Patent: Jul. 22, 2014

(54) MAGNETOSTRICTIVE RESONANT ENERGY CONVERTER

(75) Inventor: David W. Cripe, Mount Vernon, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 284 days.

(21) Appl. No.: 13/093,935

(22) Filed: Apr. 26, 2011

(51) Int. Cl.
*H01F 7/00* (2006.01)
*H01L 41/12* (2006.01)

(52) U.S. Cl.
CPC .............. *H01L 41/12* (2013.01); *H01L 41/125* (2013.01)
USPC ............................................. 335/215; 310/26

(58) Field of Classification Search
CPC .............................. H01L 41/12; H01L 41/125
USPC ............................................. 335/215; 310/26
See application file for complete search history.

(56) References Cited

U.S. PATENT DOCUMENTS 2,595,791 A * 5/1952 Hunt .............................. 310/26
3,717,039 A * 2/1973 Zinker ........................... 73/753

OTHER PUBLICATIONS

Resonance, Wikipedia, no date.*

* cited by examiner

*Primary Examiner* — Ramon Barrera
(74) *Attorney, Agent, or Firm* — Donna Suchy; Daniel M. Barbieri

(57) ABSTRACT

A resonant energy conversion apparatus may utilize magnetostrictive properties of a toroidal magnet. Electrical current induces periodic, complementary magnetic fields around separate quadrants of a toroidal magnet. The periodic, complementary magnetic fields induce mechanical changes in the toroidal magnet due to magnetostriction, causing mechanical stress in the toroidal magnet. Energy is stored as mechanical stress, and later released as electrical current.

7 Claims, 5 Drawing Sheets

MAGNETOSTRICTIVE RESONANT ENERGY CONVERTER

FIELD OF THE INVENTION

The present invention is directed generally toward energy conversion devices; specifically electronic devices with energy conversion elements utilizing magnetostriction.

BACKGROUND OF THE INVENTION

The power density of power conversion circuitry (watts per cubic inch) is related to the energy storage capacity of passive components such as inductors and capacitors. The energy density, in joules/cubic inch, of inductors and capacitors requires increases in switching frequency to attain improvements in power density, transferring this stored energy through more charge/discharge cycles per second. As switching frequency increases, switching electronics and passive circuit components lose more energy to heat loss; therefore, at increasing frequencies, the efficiency of the system diminishes. Heat loss based on switching frequency places a hard limit on the possible power density of switching power conversion circuitry.

The foundations of electrical energy conversion lie in the ability to store energy within the magnetic field of an inductor or transformer. The ubiquitous switching power converter utilizes a transistor switch to endow a magnetic device element with potential energy in the form of a magnetic field. The switching power converter then releases the potential energy at a different voltage and current, thus performing an energy conversion or transformation.

Power converters are ideally small, light, efficient and inexpensive. Based on the physical properties of the components, existing power converter technology is nearing a physical limit. For a given energy density, the losses in a radio frequency (RF) inductor vary in proportion to the ratio of the wavelength of the operating frequency to the cube root of the volume of the inductor. Consequently, to maintain efficiency of the power converter, if the size of the inductive components is decreased, the switching frequency must be increased. However, increased switching frequency leads to greater losses due to heat in the switching components of the converter. Where the heat resulting from overall system losses cannot be removed from the limited surface area of the converter, no further reduction in size is possible. A practical limitation of switching frequency is in the low megahertz (MHz) range.

Capacitors have inherently higher energy density than inductors. Switching capacitor power conversion circuits can utilize capacitors to provide superior power density than inductor-based switching circuits. However, switching capacitor circuits can only provide small-integer voltage ratio transformations, limiting their utility to power conversion rather than voltage regulation.

State of the art power conversion technology utilizes a resonant piezoelectric structure excited from an alternating voltage to provide a voltage-step-up in a manner loosely analogous to that of a magnetic voltage transformer. Power converters utilizing piezoelectric structures generate high voltages for miniature fluorescent or electroluminescent lighting. Piezoelectric devices are inherently fragile, and therefore not suitable for many applications.

Consequently, it would be advantageous if an apparatus existed that is suitable for efficiently converting power at low frequencies with high energy density, and robust enough for most applications.

SUMMARY OF THE INVENTION

Accordingly, the present invention is directed to a novel apparatus for efficiently converting power at low frequencies with high energy density, robust enough for most applications.

The present disclosure is directed to a power storage apparatus having a magnetostrictive device such as a toroidal magnet, and an electrically conductive input coil wrapped solenoidally around the minor circumference of the magnetostrictive device along a trajectory defined by the major circumference of the magnetostrictive device. The electrically conductive input coil induces mechanical deformations in the magnetostrictive device. The magnetostrictive device may have regions of varying magnetic handedness along its major circumference, causing non-uniform mechanical strain in each region relative to any adjacent regions. Based on the properties of the magnetostrictive device, varying mechanical strain may create harmonic oscillations in the magnetostrictive device. Harmonic oscillations may create stresses in the magnetostrictive device resulting in a magnetic field. A power converter may include an output coil solenoidally wrapped around the minor circumference of the magnetostrictive device to convert the magnetic field into electrical current.

It is to be understood that both the foregoing general description and the following detailed description are exemplary and explanatory only and are not restrictive of the invention claimed. The accompanying drawings, which are incorporated in and constitute a part of the specification, illustrate an embodiment of the invention and together with the general description, serve to explain the principles.

BRIEF DESCRIPTION OF THE DRAWINGS

The numerous objects and advantages of the present invention may be better understood by those skilled in the art by reference to the accompanying figures in which.

DETAILED DESCRIPTION OF THE INVENTION

Figure 1:
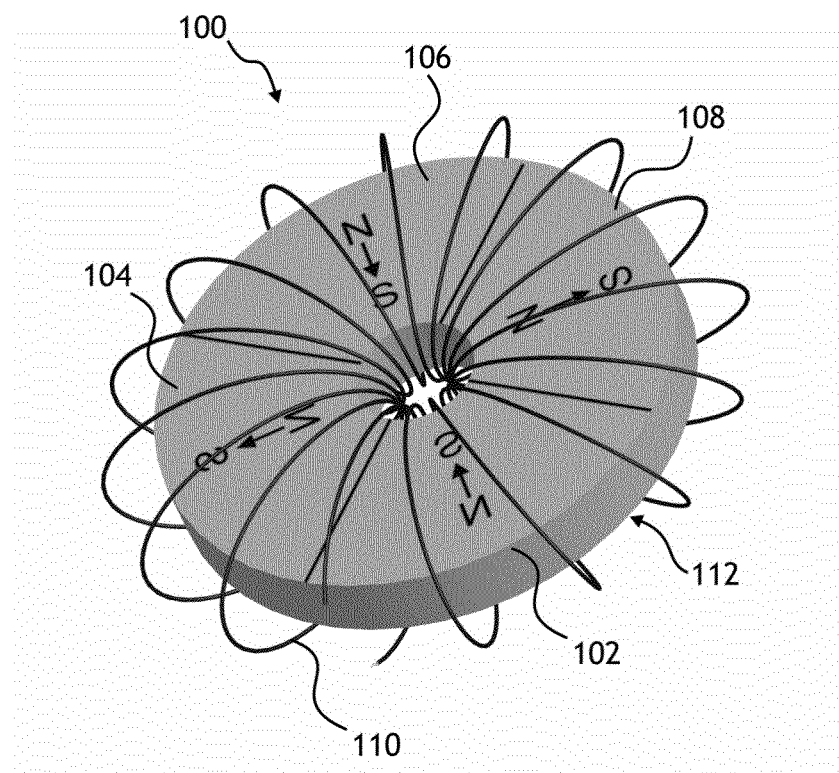
FIG. 1 shows a perspective view of one embodiment of the present invention.

Referring to FIG. 1, a magnetostrictive converter 100 may have a multi-quadrant toroidal magnet 112 overwound with one or more solenoid coils around its minor circumference. 110. The multi-quadrant toroidal magnet 112 may have quadrants 102, 104, 106, 108 along its major circumference of alternating magnetic orientation circumferentially oriented around its minor circumference.

Figure 2:
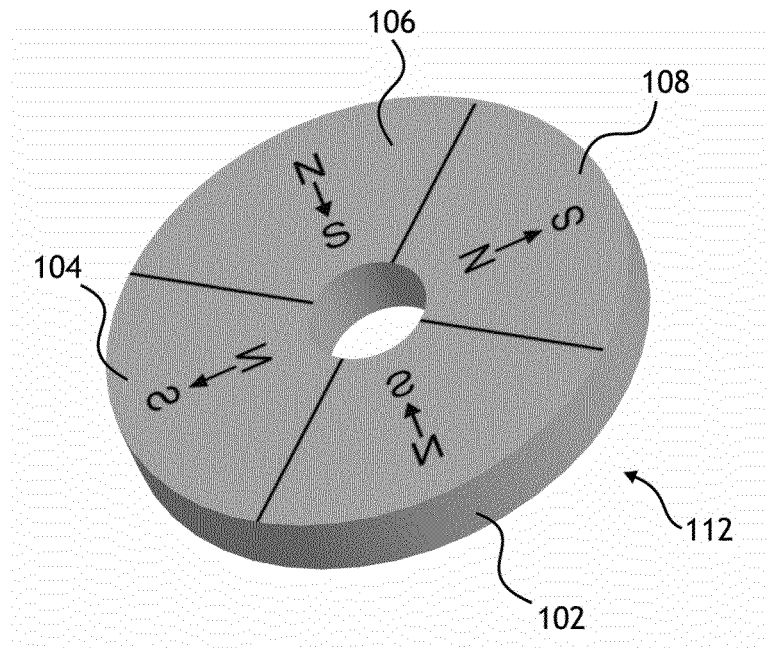
FIG. 2 shows a perspective view of a toroidal magnet used in the embodiment shown in FIG. 1.

Referring to FIG. 2, the toroidal magnet may have a first toroidal magnet quadrant 102 and a third toroidal magnet quadrant 106 with remanent, permanent magnetization orientation with polarization corresponding to that produced by an electrical current traveling counterclockwise around the major circumference of the toroidal magnet 100. The toroidal magnet may have a second toroidal magnet quadrant 104 and a fourth toroidal magnet quadrant 108 with remanent, permanent magnetization with polarization corresponding to that produced by an electrical current traveling clockwise around the major circumference of the toroidal magnet 100. The magnetic orientation of quadrant 102, 104, 106, 108 may alternate such that the remanent magnetization of each quadrant 102, 104, 106, 108 opposes the direction of the remanent magnetization of each adjacent quadrant 102, 104, 106, 108.

Referring again to FIG. 1, a solenoid coil surrounding the minor circumference of the toroid, extending axially along the length of its major circumference 110, suitable for carrying an alternating electrical current of an appropriate frequency, may wind around the toroidal magnet 112. The solenoid coil 110 may wind around the toroidal magnet 112 such that a current flowing through the axial solenoid coil 110 may generate a magnetic field along the major circumference of the toroid, orthogonally to the permanent magnetic orientation of the various quadrants 102, 104, 106, 108 of the toroidal magnet 112.

Application of a magnetic field to a magnetostrictive material results in a change in its dimensions. Similarly, application of a stress to a magnetostrictive material causes a change in its permeability in the direction of the application of the force (magnetoelasticity). The Wiedemann effect manifests when an axial magnetic field is applied to a magnetostrictive body endowed with circumferential magnetization, generating a torsional shear stress. The Garshelis effect is a special case of the inverse-Wiedemann effect wherein a torsional shear stress applied to a magnetoelastic body with a circumferential remnant magnetization results in a helical precession of the domain orientation, creating an axial magnetic field. The Wiedemann and Garshelis effects may be considered reciprocal.

Alternating current flowing through the solenoid coil 110 creates an alternating, circular magnetic field within the body of the toroid. The magnetic field is orthogonal to the permanent, circumferential magnetic remanences in each of the quadrants 102, 104, 106, 108 of the toroidal magnet 112. The combination of a the magnetic field created by the axial solenoid coil 110 and the minor-circumferential magnetic fields in the toroidal magnet 112 causes helical, torsional mechanical shear stress in the toroidal magnet as localized regions in the toroidal magnet 112 change shape due to the Wiedemann effect. As the magnetic field created by the axial solenoid coil 110 is applied to the toroidal magnet, adjacent quadrants 102, 104, 106, 108 of the toroidal magnet experience opposing helical, torsional mechanical stresses. The difference in the mechanical stresses of adjacent quadrants 102, 104, 106, 108 may cause physical deformation of the toroidal magnet.

Figure 3:
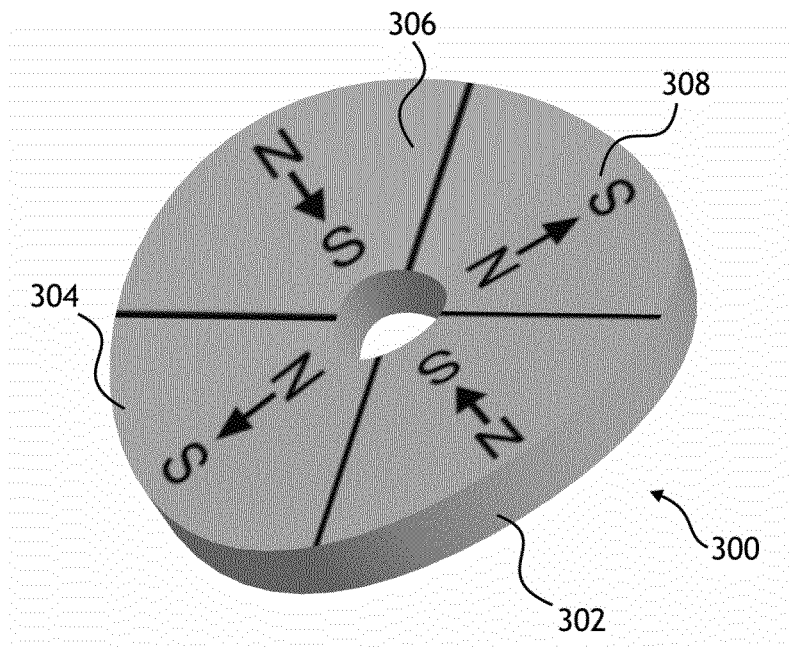
FIG. 3 shows a perspective view of the toroidal magnet in FIG. 2 undergoing magnetostrictive mechanical distortion.
Figure 4:
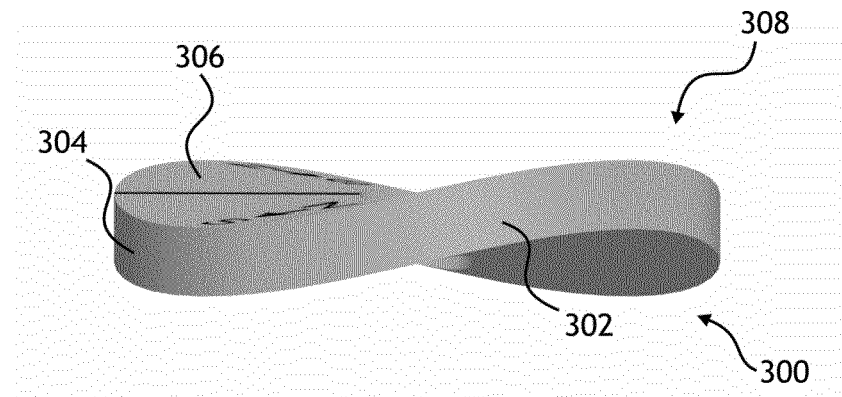
FIG. 4 shows a side view of the toroidal magnet shown in FIG. 3.

Referring to FIG. 3 and FIG. 4, a stressed toroidal magnet 300 may be physically distorted due to mechanical stress. Circumferential magnetic polarization in two oppositely polarized regions will result in opposite torsional forces within opposite regions causing a saddle-shaped deformation of the toroid. While a first toroidal magnet quadrant 302 and a third toroidal magnet quadrant 306 may undergo in one dimension, a second toroidal magnet quadrant 304 and a fourth toroidal magnet quadrant 308 may undergo deformation in another dimension. The difference in deformation of the quadrants 302, 304, 306, 308 results in mechanical strain in the toroidal magnet 300. Physical distortion of the toroidal magnet 300 acts as an energy storage mechanism, much like a spring. The potential energy density within a mechanical spring is orders of magnitude greater than potential energy density within electric or magnetic storage media.

Toroidal magnets of a certain composition may have natural harmonic oscillation frequencies. Alternating magnetic fields within these magnets at an appropriate frequency may create periodic mechanical stress. If the periodic mechanical stress occurs at a harmonic frequency to the natural harmonic oscillation of the toroidal magnet 300, magnetic energy may be efficiently converted to mechanical oscillations. It is possible to couple an electronic oscillation via a coil conductor to a magneto-mechanical resonator to excite a mechanically-resonant body to a high amplitude of oscillation. Energy can be transferred through this body at power densities and efficiencies significantly higher than that possible with a purely electromagnetic circuit.

Changing mechanical stress in the toroidal magnet may produce its own magnetic field as a result of the Garshelis effect, inducing a counter electromagnetic field (EMF) in an axial solenoid coil. The effect of this counter-EMF effect due to the resonance of the toroidal magnet 112 is to multiply the effective permeability of the magnetic circuit formed by the toroidal magnet 112 significantly above that of the magnetostrictive material alone. Consequently, the toroidal magnet 112 can be much smaller than an equivalent conventional inductor or transformer when applied as an energy conversion device.

Deformation of the toroidal magnet 112 through electronic excitation should be limited to reversible or elastic deformation. Because mechanical strain in the toroidal magnet 112 is an energy storage mechanism, irreversible or plastic deformation of the toroidal magnet 112 would compromise its usefulness. Therefore, in any embodiment of the present invention, current applied to the axial solenoid coil 110 should stay within certain voltage and frequency limits defined by the material of the toroidal magnet 112 to prevent plastic deformation.

While FIG. 1 shows a solenoid coil 110 with sixteen turns, the actual number of turns in any particular implementation may be a function of the materials comprising the toroidal magnet 112, the frequency of current used, and the intended power conversion application.

Figure 5:
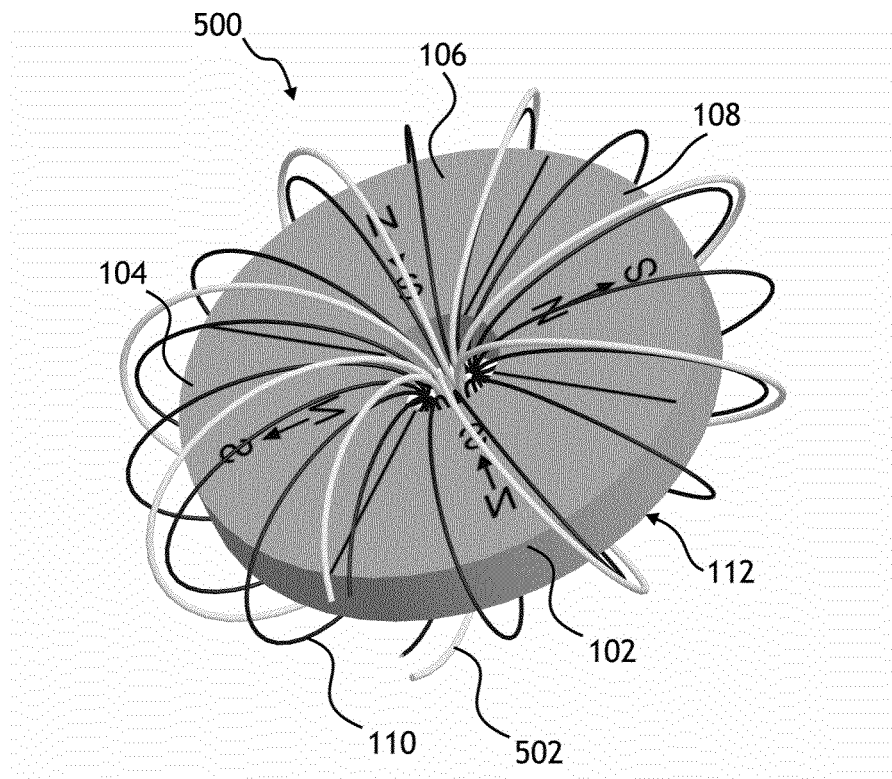
FIG. 5 shows a perspective view of another embodiment of the present invention.
Figure 6:
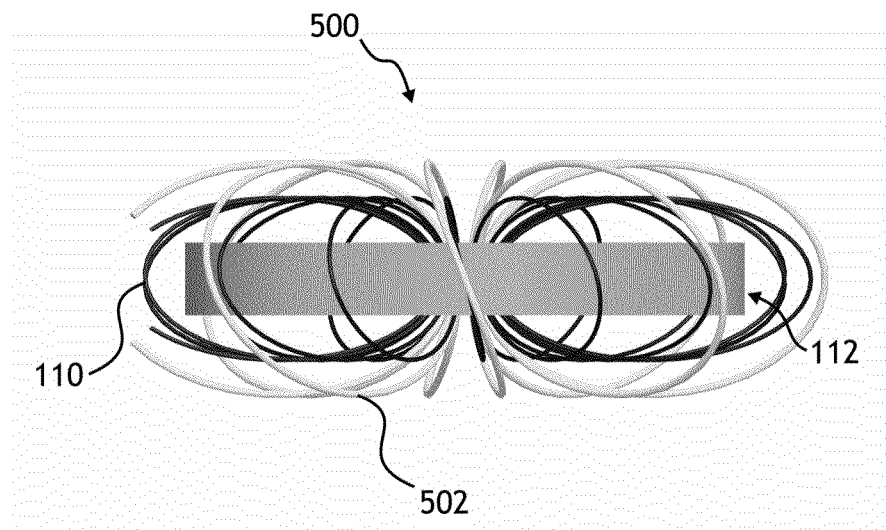
FIG. 6 shows a side view of the embodiment shown in FIG. 5.
Figure 7:
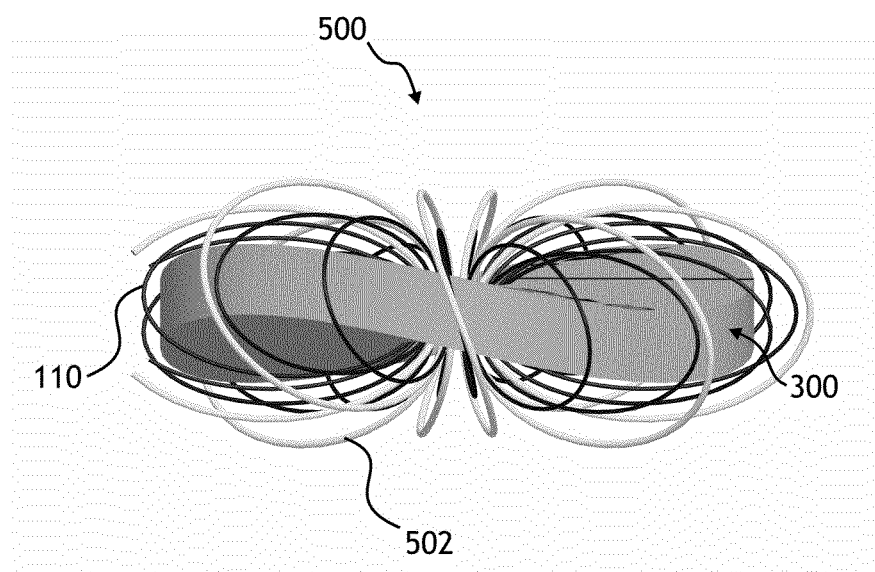
FIG. 7 shows a side view of the embodiment shown in FIG. 6 undergoing magnetostrictive mechanical distortion.

Referring to FIG. 5 and FIG. 6, in a power converter embodiment 500, multiple independent solenoid coils may overwind the toroidal magnet. One axial solenoid coil 110 may carry a current at a certain voltage or frequency while a converter output coil 502 draws current at a different voltage or frequency. Multiple solenoid coils may behave analogously to a conventional transformer. Referring to FIG. 7, in the power converter embodiment 500, a current at an appropriate frequency may flow through the solenoid coil 110. The frequency of the current flowing through the axial solenoid coil may be at some harmonic of the natural frequency of the material comprising the toroidal magnet 300. The harmonic frequency of the current induces oscillating strain in the toroidal magnet 300 because of the varying magnetostrictive response of the different quadrants 302, 304, 306, 308 of the toroidal magnet 300. Changes in the shape of the toroidal magnet 300 due to the oscillating strain may induce a magnetic field in the toroidal magnet 300. This may induce a counter EMF in the solenoidal coil 110. The EMF field may induce an electrical current in the converter output coil 502. Output voltage and frequency in the converter output coil 502 are governed by relationships known in the art. One skilled in the art will appreciate that while FIG. 1, FIG. 5, FIG. 6 and FIG. 7 show toroidal magnets 112, 300 with coils 110, 502 spaced some distance from the surface of the toroidal magnets 112, 300, in actual application the various coils 110, 502 may be tightly wound.

Figure 8:
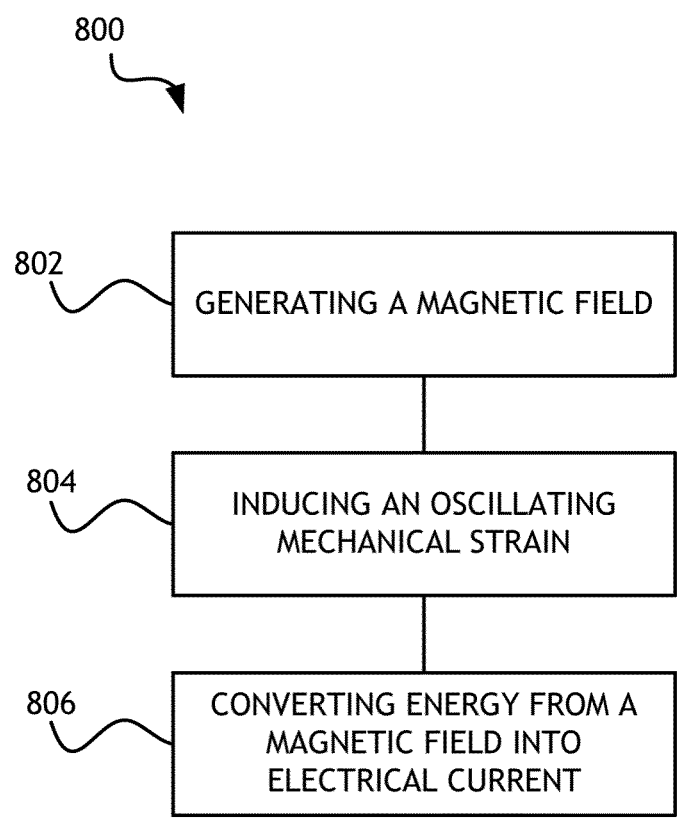
FIG. 8 shows a flowchart of another embodiment of the present invention.

Referring to FIG. 8, another embodiment of the present invention is a method for converting energy 800 utilizing an apparatus similar to that disclosed herein. The method for converting energy 800 may include generating 802 an oscillating magnetic field with an axial solenoid coil wound around a toroidal magnet comprising four minor-circumferentially magnetized regions of alternating handedness. Generating 802 the oscillating magnetic field may induce 804 oscillating mechanical strain in the toroidal magnet. Oscillating mechanical strain may induce a harmonic oscillation in the toroidal magnet. Harmonic oscillations in the toroidal magnet may create a major-circumferential magnetic field. This magnetic field may induce a counter EMF in the solenoidal coil 110. The method for converting energy 800 may include converting 806 energy from the EMF field induced by oscillating mechanical strain in the toroidal magnet into electrical current with an axial coil.

The present invention to exploit magneto-mechanical energy storage in a power conversion application allows significant decrease in the size required for power conversion components, and reduction in operating frequencies while maintaining the electrical efficiencies of the power electronics.

Materials suitable for use as a toroidal magnet 112 in the present embodiment have a high coefficient of magnetostriction, as well as a high magneto-elasticity tensor coefficient. The material may also have a high yield strength and low mechanical hysteresis. Possible materials include structural permanent-magnet alloys such as Vicalloy or FeCoCr, steels such as T250, high-nickel steels such as 4820 or 9310, or magnetic alloys such as 45 Permalloy or nickel.

Appropriate material, shaped into a toroid, may be treated to possess a remnant circumferential remanent magnetization in four alternating quadrants of opposite orientation based on the right-hand-rule. Current pulses through four, diametrically opposite points on the toroid induce the appropriate magnetic orientation. Maintenance of the circumferential magnetic remnant may require a highly-coercive alloy, (permanent magnet material) and/or heat treatment to optimize magnetic hardness. Alternately, a low-coercivity material such as Permalloy or nickel, uni-axial circumferential stress anisotropy may endow the surface shell material with a circumferential magnetic easy-axis of permeability.

Iron based magnetic materials possess nominally the same high Young's Modulus characteristic of all steels. Most iron based magnetic materials have high yield strengths as well. As such, iron based magnetic materials are capable of storing potential energy in the form of elastic deformation. The volumetric density of mechanical energy storage is several orders of magnitude greater than the volumetric density of magnetic energy storage within the same volume.

It is believed that the present invention and many of its attendant advantages will be understood by the foregoing description, and it will be apparent that various changes may be made in the form, construction, and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. An energy conversion apparatus comprising:
    a toroidal magnet for storing energy as mechanical strain through magneto-mechanical resonance comprising at least four circumferentially magnetized regions having alternating handedness;
    an electrically conductive input coil for inducing mechanical strain in the toroidal magnet, wrapped around a minor circumference of the toroidal magnet; and
    one or more electrically conductive output coils for conducting electrical current induced by oscillations in the toroidal magnet, wrapped around the minor circumference of the toroidal magnet.

2. The apparatus of claim 1, wherein the toroidal magnet is comprised of a magnetostrictive, ferromagnetic material.

3. The apparatus of claim 2, wherein the toroidal magnet is comprised of an alloy containing cobalt, iron and vanadium.

4. The apparatus of claim 2, wherein the toroidal magnet is comprised of an alloy containing cobalt, iron and chromium.

5. The apparatus of claim 2, wherein the toroidal magnetic is comprised of an alloy containing nickel and iron.

6. The apparatus of claim 2, wherein the toroidal magnetic is comprised of an alloy containing nickel, iron, chromium and molybdenum.

7. A method of converting energy comprising:
    generating a magnetic field with an axial solenoid coil around a toroidal magnet comprising four circumferentially magnetized regions of alternating handedness;
    inducing oscillating mechanical strain in the toroidal magnet; and
    converting energy from an electromagnetic field induced by oscillating mechanical strain in the toroidal magnet into electrical current with the axial solenoid coil.

\* \* \* \* \*